US011197383B2

(12) United States Patent
Ye et al.

(10) Patent No.: US 11,197,383 B2
(45) Date of Patent: Dec. 7, 2021

(54) HOUSING, HOUSING MANUFACTURING METHOD AND MOBILE TERMINAL

(71) Applicant: GUANGDONG EVERWIN PRECISION TECHNOLOGY CO., LTD., Dongguan (CN)

(72) Inventors: Zhigao Ye, Dongguan (CN); Xiaohong Zou, Dongguan (CN); Jifeng Lai, Dongguan (CN); Hongjin Tan, Dongguan (CN)

(73) Assignee: GUANGDONG EVERWIN PRECISION TECHNOLOGY CO., LTD., Dongguan (CN)

( * ) Notice: Subject to any disclaimer, the term of this patent is extended or adjusted under 35 U.S.C. 154(b) by 74 days.

(21) Appl. No.: 16/474,983

(22) PCT Filed: Nov. 15, 2017

(86) PCT No.: PCT/CN2017/111010
§ 371 (c)(1),
(2) Date: Jun. 28, 2019

(87) PCT Pub. No.: WO2019/019487
PCT Pub. Date: Jan. 31, 2019

(65) Prior Publication Data
US 2019/0350098 A1    Nov. 14, 2019

(30) Foreign Application Priority Data

Jul. 24, 2017   (CN) .................. 201710608311.X

(51) Int. Cl.
*H05K 5/04*     (2006.01)
*H05K 5/02*     (2006.01)
(Continued)

(52) U.S. Cl.
CPC ........... *H05K 5/0217* (2013.01); *B22D 19/04* (2013.01); *B29C 45/14508* (2013.01);
(Continued)

(58) Field of Classification Search
CPC .... B22D 19/04; B29C 45/14508; H05K 5/04; H05K 5/0217
See application file for complete search history.

(56) References Cited

U.S. PATENT DOCUMENTS 4,323,406 A * 4/1982 Morello ................. B29C 33/14
156/212
5,244,746 A * 9/1993 Matsui ...................... B32B 3/30
191/22 DM (Continued)

FOREIGN PATENT DOCUMENTS

| CN | 204517886 U | 7/2015 |
| CN | 105847495 A | 8/2016 |
| CN | 106944797 A | 7/2017 |

OTHER PUBLICATIONS

International Search Report, dated Apr. 19, 2018 for corresponding International Application No. PCT/CN2017/111010 with English translation.
Written Opinion of the ISA, dated Nov. 23, 2017 for corresponding International Application No. PCT/CN2017/111010.

*Primary Examiner* — Abhishek M Rathod
*Assistant Examiner* — Keith DePew
(74) *Attorney, Agent, or Firm* — W&G Law Group

(57) ABSTRACT

A housing, a housing manufacturing method, and a mobile terminal. The housing comprises a metal body, and a connecting body; the metal body at least comprises a first body, and a second body; the connecting body at least comprises a first connecting body. The first body and the second body are connected by means of the first connecting body. A plurality of mating structures are formed at the joint of the first body, the second body and the first connecting body.

(Continued)

Each mating structure comprise at least one of a groove tension structure, a protrusion tension structure, a rib tension structure, a through-hole fastening structure, a hole-site knurling rib structure and an inner-hole groove structure. Structural stability of the joint of the housing can be effectively enhanced by means of the described manners.

16 Claims, 6 Drawing Sheets

(51) Int. Cl.
| | | |
|---|---|---|
| *B22D 19/04* | (2006.01) | |
| *B29C 45/14* | (2006.01) | |
| B29K 67/00 | (2006.01) | |
| B29K 77/00 | (2006.01) | |
| B29K 81/00 | (2006.01) | |
| B29K 309/08 | (2006.01) | |
| B29K 705/00 | (2006.01) | |
| B29L 31/34 | (2006.01) | |

(52) U.S. Cl.
CPC ...... *H05K 5/04* (2013.01); *B29C 2045/14516* (2013.01); *B29C 2045/14532* (2013.01); *B29K 2067/006* (2013.01); *B29K 2077/00* (2013.01); *B29K 2081/04* (2013.01); *B29K 2309/08* (2013.01); *B29K 2705/00* (2013.01); *B29L 2031/3481* (2013.01)

(56) References Cited

U.S. PATENT DOCUMENTS

| | | | | |
|---|---|---|---|---|
| 8,772,650 | B2 * | 7/2014 | Merz | H05K 5/0004 |
| | | | | 174/520 |
| 9,894,787 | B2 * | 2/2018 | Merz | H05K 5/0247 |
| 9,901,002 | B2 * | 2/2018 | Jenkins | B29C 65/70 |
| 10,433,442 | B2 * | 10/2019 | Merz | H05K 5/0004 |
| 2007/0290411 | A1 * | 12/2007 | Suter | B29C 45/1618 |
| | | | | 264/510 |
| 2008/0282528 | A1 * | 11/2008 | Lu | B29C 45/14311 |
| | | | | 29/525 |
| 2012/0175165 | A1 * | 7/2012 | Merz | H05K 5/0217 |
| | | | | 174/520 |
| 2013/0318766 | A1 * | 12/2013 | Kiple | H05K 5/03 |
| | | | | 29/428 |
| 2013/0319755 | A1 * | 12/2013 | Kiple | C25D 7/00 |
| | | | | 174/562 |
| 2014/0311767 | A1 * | 10/2014 | Merz | G06F 1/1656 |
| | | | | 174/50 |
| 2015/0050453 | A1 * | 2/2015 | Carson, Jr. | B29C 66/12449 |
| | | | | 428/134 |
| 2016/0207236 | A1 * | 7/2016 | Tsubota | B29C 45/14344 |
| 2016/0286670 | A1 * | 9/2016 | Wang | G02F 1/133308 |
| 2017/0136686 | A1 * | 5/2017 | Ueno | F16B 5/045 |
| 2017/0245382 | A1 * | 8/2017 | Jenkins | B32B 3/06 |
| 2018/0070465 | A1 * | 3/2018 | Cater | H01Q 1/24 |
| 2019/0045642 | A1 * | 2/2019 | Prest | H05K 5/006 |
| 2019/0246511 | A1 * | 8/2019 | Huang | H04M 1/0277 |
| 2020/0141259 | A1 * | 5/2020 | Inoue | B29C 65/1412 |

* cited by examiner

HOUSING, HOUSING MANUFACTURING METHOD AND MOBILE TERMINAL

TECHNICAL FIELD

The present disclosure relates to the field of housing technology, particularly to a housing, a housing manufacturing method and a mobile terminal.

BACKGROUND

Currently, the mobile terminal split type housings are mainly divided into three types: nano injection molding products, in-mold injection products, and in-mold die-casting products. The disadvantages of nano injection products lies in that the adhesive forces are not strong enough, so they are easy to crack. The disadvantages of in-mold injection products lies in that the bonding forces of plastic and metal are not enough, so they are easy to be detached. The disadvantages of in-mold die-casting products lies in that the strengths of the bonding positions of the metal and the metal are weak, so they are easy to be broken.

SUMMARY

The present disclosure provides a housing, a housing manufacturing method and a mobile terminal, which can effectively enhance the structural stability of the junctions of the various components of the housing, and ensure that the various components of the housing are not easily separated.

A technical solution adopted by the present disclosure is to provide a housing. The housing includes a metal body and a connecting body connected to the metal body, and the metal body is provided with a mating structure at a junction with the connecting body. The mating structure includes at least one selected from the group consisting of a groove-type tension structure, a protrusion-type tension structure, a rib-type tension structure, a rib-in-hole type structure, an groove-in-hole type structure and a through hole type fastening structure.

Another technical solution adopted by the present disclosure is to provide a method of manufacturing a housing. The method includes: providing a metal plate; machining the metal plate to obtain a metal body and a mating structure, wherein the mating structure comprises at least one selected from the group consisting of a groove-type tension structure, a protrusion-type tension structure, a rib-type tension structure, a rib-in-hole type structure, an groove-in-hole type structure and a through hole type fastening structure; placing the metal body into a mold, injecting the material of a connecting body into the mating structure and on an outside of the metal body via an integral molding technique, thus forming the connecting body.

A further technical solution adopted by the present disclosure is to provide a mobile terminal comprising a housing. The housing includes a metal body and a connecting body connected to the metal body, and the metal body is provided with a mating structure at a junction with the connecting body. The mating structure includes at least one selected from the group consisting of a groove-type tension structure, a protrusion-type tension structure, a rib-type tension structure, a rib-in-hole type structure, a groove-in-hole type structure and a through hole type fastening structure.

The beneficial effects of the present disclosure are described as follows: the metal body of the housing according to the present disclosure is provided with a mating structure at a junction with the connecting body, and the mating structure comprises at least one selected from the group consisting of a groove-type tension structure, a protrusion-type tension structure, a rib-type tension structure, a through hole type fastening structure, a rib-in-hole type structure, and an groove-in-hole type structure. In this way, it is possible to achieve the effect of increasing the mechanical contact area between the body and the connecting body, thereby enhancing the structural stability of the junction of the housing and ensuring that the various components of the housing are not easily separated.

BRIEF DESCRIPTION OF THE DRAWINGS

To illustrate the technical solutions according to the embodiments of the present disclosure more clearly, the accompanying drawings for describing the embodiments are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF EMBODIMENTS

The technical solutions of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present disclosure without creative efforts shall fall within the protection scope of the present invention.

A mobile terminal in the embodiments of the present disclosure comprises electronic devices such as a smart mobile phone, a tablet computer, a smart wearable device, a digital audio and video player, an electronic reader, a portable game machine, and an in-vehicle electronic device and the like.

In addition, terms "first", "second", "third" are used herein for descriptive purposes only, and are not to be construed as indicating or implying a relative importance of the technical features or as implicitly indicating the number of technical features indicated. Thus, features defined by "first", "second" or "third" may explicitly or implicitly comprise at least one such feature. In the description of the present disclosure, term "a plurality of" means at least two, such as two, three, etc., unless clearly and specifically defines otherwise. Furthermore, the terms "comprise", "have" and any variations thereof, are intended to cover non-exclusive inclusions, such that a process, method, system, article, or apparatus that comprises a list of steps or elements are not necessarily limited to those steps or elements, but may optionally comprise other steps or elements not expressly listed or inherent to such process, method, article, or apparatus.

Reference to "embodiment" herein mean that a particular feature, structure, or characteristic described in combination with embodiment can be comprised in at least one embodiment of the present disclosure. The appearances of this phrases in various places in the specification are not necessarily referring to the same embodiments, and are not independent or alternative embodiments that are mutually exclusive with other embodiments.

Figure 1:
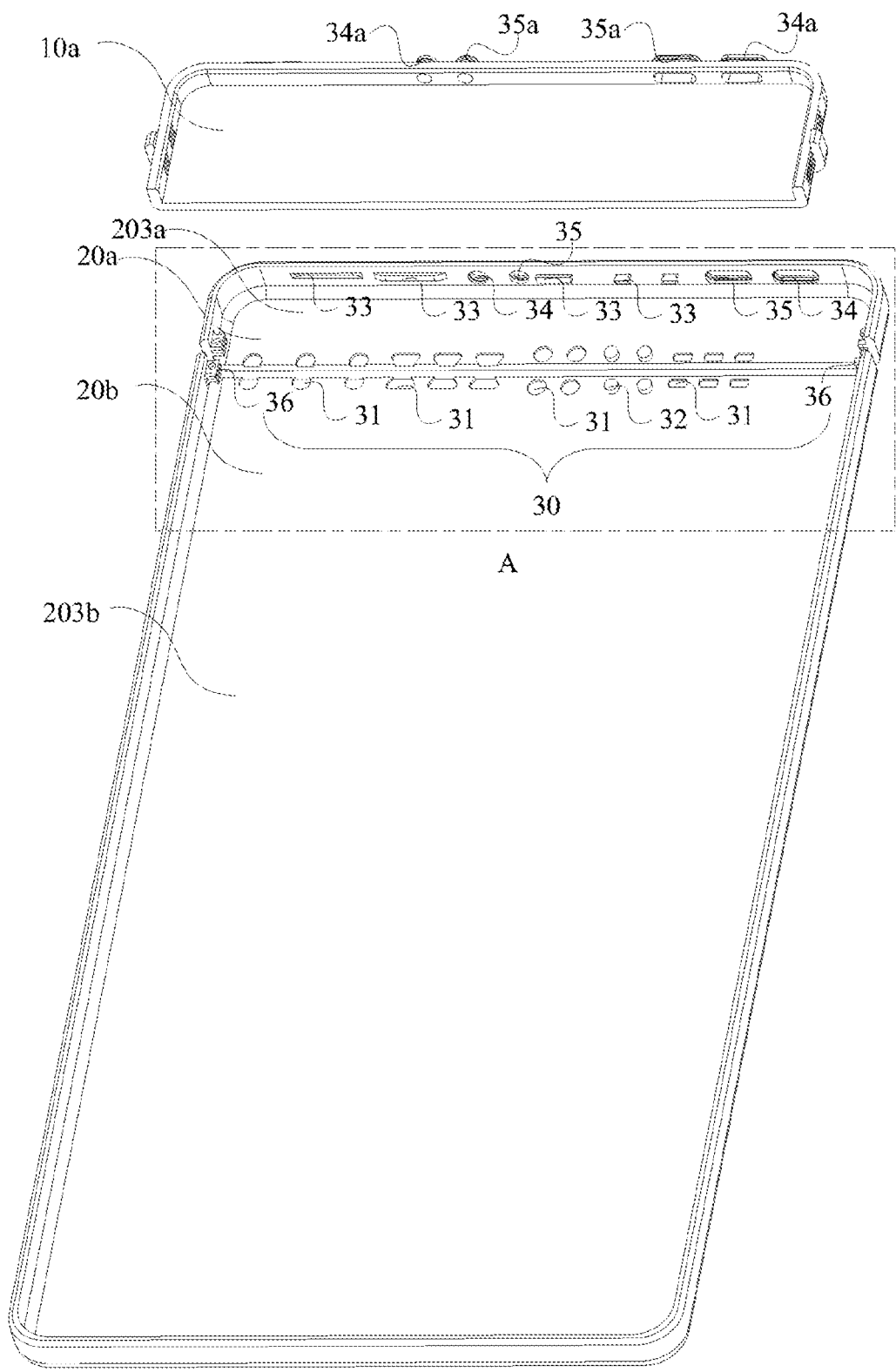
FIG. 1 is a schematic exploded view of a housing according to an embodiment of the present disclosure.

Please referring to FIG. 1, FIG. 1 is a schematic exploded view of a housing according to an embodiment of the present disclosure. In this embodiment, the housing includes a connecting body and a metal body. The connecting body includes a first connecting body 10a. The metal body includes a first body 20a and a second body 20b. The first body 20a and the second body 20b are connected via the first connecting body 10a. A plurality of mating structures 30 are formed at the junctions (not shown) of the first body 20a, the second body 20b and the first connecting body 10a.

The mating structure 30 includes at least one selected from the group consisting of a groove-type tension structure 31, a protrusion-type tension structure 32, a rib-type tension structure 33, a rib-in-hole type structure 34, a groove-in-hole type structure 35 and a through hole type fastening structure 36. Optionally, in this embodiment, the mating structure 30 includes each one of the groove-type tension structure 31, the protrusion-type tension structure 32, the rib-type tension structure 33, the rib-in-hole type structure 34, the groove-in-hole type structure 35 and the through hole type fastening structure 36, which are evenly distributed at the junctions of the first body 20a, the second body 20b and the first connecting body 10a, such that the junction structure of the housing is more stable and hard to crack. The number of each mating structure 30 depends on the junction area of the first body 20a, the second body 20b, and the first connecting body 10a, the overall strength of the housing, and the difficulty of manufacturing. The number of each mating structure 30 corresponding to the housing in each case is not listed here.

Figure 2:
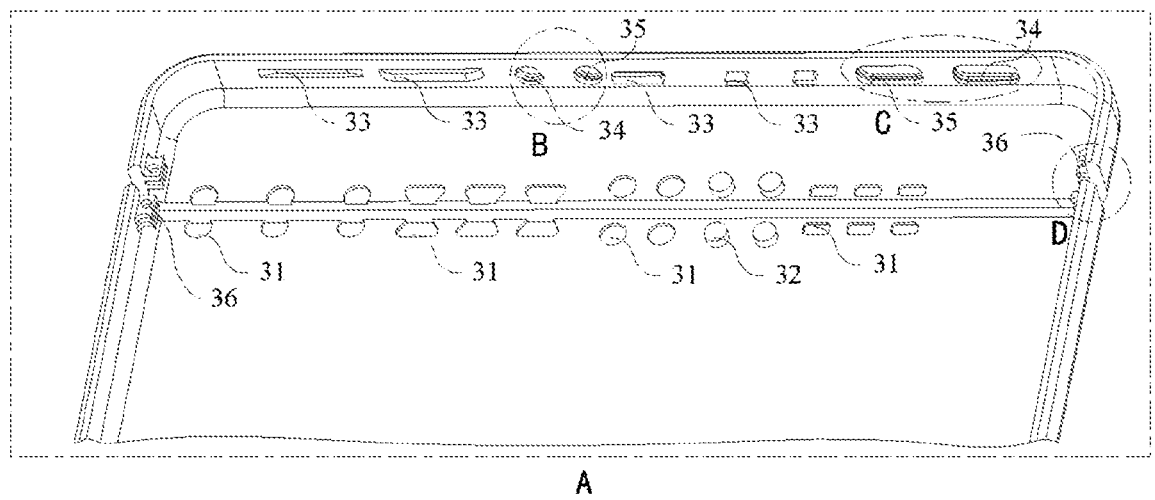
FIG. 2 is a partial enlarged view of the area A in FIG. 1.

Please referring to FIG. 1 and FIG. 2, FIG. 2 is a partial enlarged view of the area A in FIG. 1. By machining a groove on the first body 20a or on the second body 20b and fully filling the groove with the material of the first connecting body 10a, the groove-type tension structure 31 is formed at the junction of the first body 20a, the second body 20b, and the first connecting body 10a. The shape of the groove includes at least one selected from the group consisting of a semicircle, a circle, an ellipse, a dovetail, and a polygon. By machining a protrusion on the first body 20a or on the second body 20b and fully filling the material of the first connecting body 10a around the protrusion, the protrusion-type tension structure 32 is formed at the junction of the first body 20a, the second body 20b and the first connecting body 10a. The shape of the protrusion includes at least one selected from the group consisting of a semicircle, a circle, an ellipse, a dovetail, and a polygon. Optionally, the shapes of the groove and the protrusion may also be of other regular or irregular shapes that can be machined, which are not enumerated in this application.

Please referring to FIG. 2, by machining a rib on the first body 20a or on the second body 20b and fully filling the material of the first connecting body 10a around the rib, the rib-type tension structure 33 is formed at the junction of the first body 20a, the second body 20b and the first connecting body 10a. The shape of the rib includes at least one selected from the group consisting of a rectangular, an L, a trapezoidal or a semi-elliptical. Optionally, the shape of the rib may also be of other regular or irregular shapes that can be machined, which are not enumerated in this application.

Figure 3:
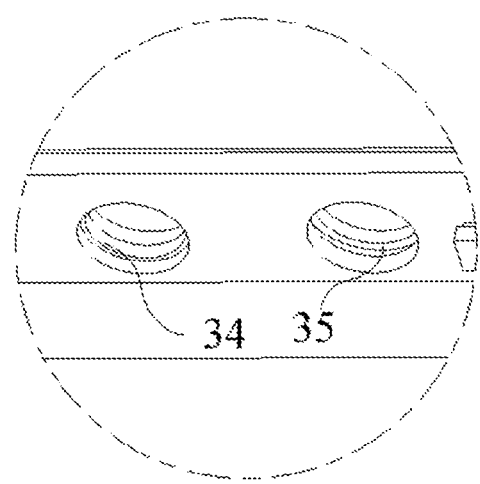
FIG. 3 is a partial enlarged view of the area B in FIG. 2.
Figure 4:
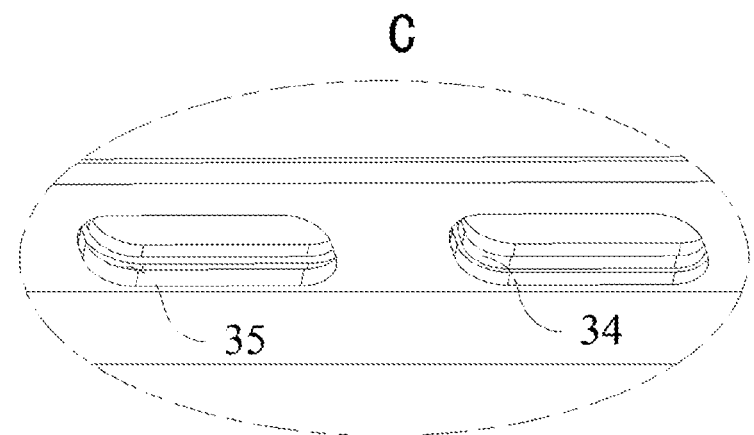
FIG. 4 is a partial enlarged view of the area C in FIG. 2.

Please referring to FIG. 3 and FIG. 4, FIG. 3 is a partial enlarged view of the area B in FIG. 2, and FIG. 4 is a partial enlarged view of the area C in FIG. 2. By machining a rib protrusion inside the hole on the first body 20a or on the second body 20b and fully filling the material of the first connecting body 10a around the rib protrusion, the rib-in-hole type structure 34 is formed at the junction of the first body 20a, the second body 20b and the first connecting body 10a. The shape of the rib protrusion includes at least one selected from the group consisting of a rectangular, a semi-circular, a trapezoidal or a zigzag. By machining a groove inside the hole on the first body 20a or on the second body 20b and fully filling the groove with the material of the first connecting body 10a, the groove-in-hole type structure 35 is formed at the junction of the first body 20a, the second body 20b and the first connecting body 10a, and the shape of the groove includes at least one selected from the group consisting of a rectangular, a semicircle, a trapezoidal, and a zigzag. Optionally, the shapes of the rib protrusion and the groove may also be of other regular or irregular shapes that can be machined, which are not enumerated in this application.

Figure 5:
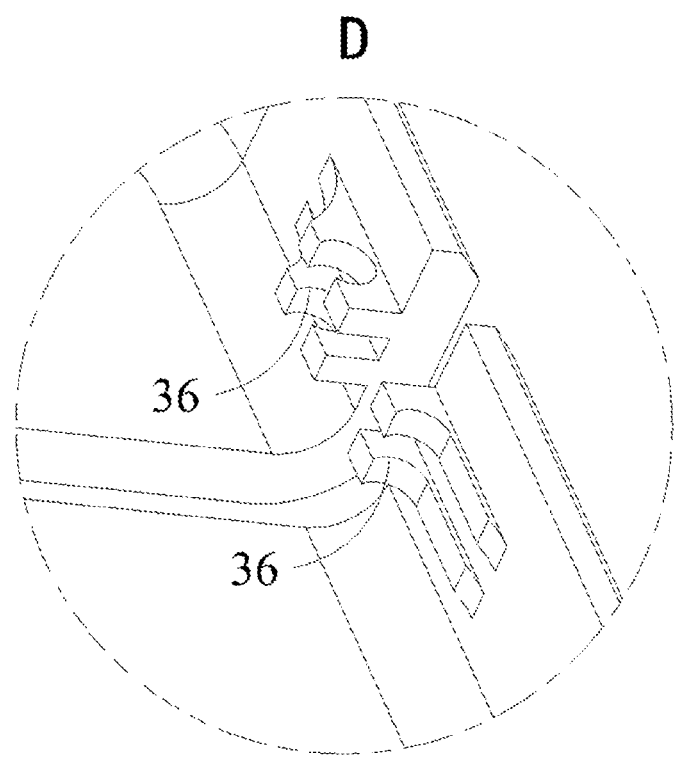
FIG. 5 is a partial enlarged view of the area D in FIG. 2.

Please referring to FIG. 2 and FIG. 5, FIG. 5 is a partial enlarged view of the area D in FIG. 2. By machining a hole on the first body 20a or on the second body 20b, fully filling the hole with the material of the first connecting body 10a, the through hole type fastening structure 36 is formed at the junction of the first body 20a, the second body 20b and the first connecting body 10a, and the shape of the hole includes at least one selected from the group consisting of a circle, a semicircle, an ellipse and a semi-ellipse. Optionally, the shape of the hole may also be of other regular or irregular shapes that can be machined, which are not enumerated in this application.

Figure 6:
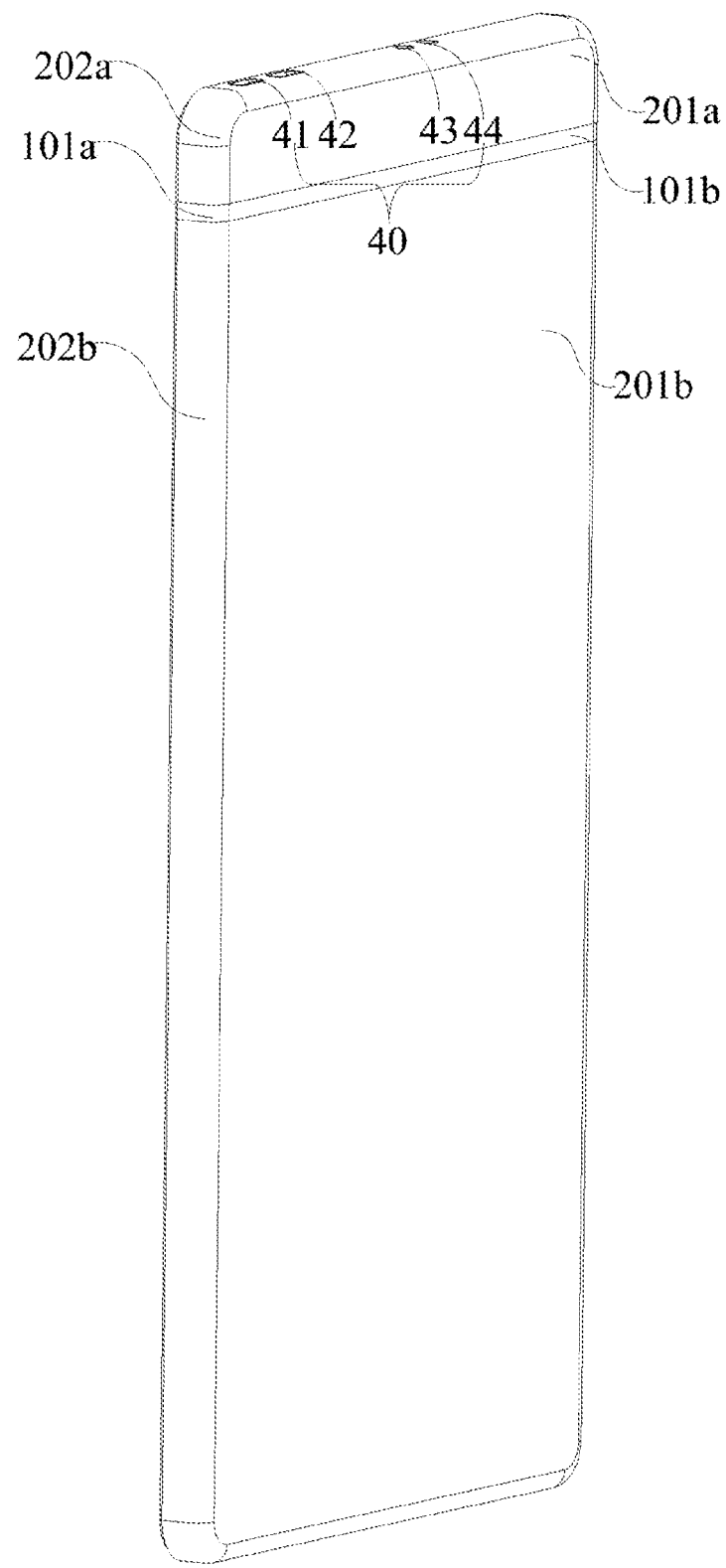
FIG. 6 is a schematic view of the assembly structure of the housing in FIG. 1.

Please referring to FIG. 1 and FIG. 6, FIG. 6 is a schematic view of the assembly structure of the housing in FIG. 1. The first body 20a includes a first body base 201a, and a first body retaining edge 202a connected to the first body base 201a and perpendicular to the first body base 201a. The first body retaining edge 202a and the first body base 201a are connected to form a first receiving groove 203a. The second body 20b includes a second body base 201b, and a second body retaining edge 202b connected to the second body base 201b and perpendicular to the second body base 201b. The second body retaining edge 202b and the second body base 201b are connected to form a second receiving groove 203b. Optionally, a surface of the first connecting body 10a, a surface of the first body base 201a away from the first receiving groove 203a, and a surface of the second body base 201b away from the second receiving groove 203b are coplanar. Such arrangement can increase the flatness of the surface of the housing and prevent the housing from scratching the user's hand.

Further, the housing is provided with holes 40, which may be located at the first body retaining edge 202a and/or the second body retaining edge 202b. The holes 40 includes at least one selected from the group consisting of a speaker ventilation hole, a microphone input hole, a USB jack and an earphone jack. In this embodiment, the holes are located on the first body retaining edge 202a, and include a USB jack 41, a speaker ventilation hole 42, an earphone jack 43, and a microphone input hole 44. Optionally, the rib-in-hole type structure 34 having a rib protrusion in a trapezoidal shape is provided in the hole 41; the groove-in-hole type structure 35 having a groove in a trapezoidal shape is provided in the hole 42; the groove-in-hole type structure 35 having a groove in a rectangular shape is provided in the hole 43, and the rib-in-hole type structure 34 having a rib protrusion in a rectangular shape is provided in the hole 44. In other embodiments, the position or number of the holes, the shapes of the rib-in-hole type structure or the groove-in-hole type structure in the hole may be of other manners, which are not enumerated herein.

Figure 7:
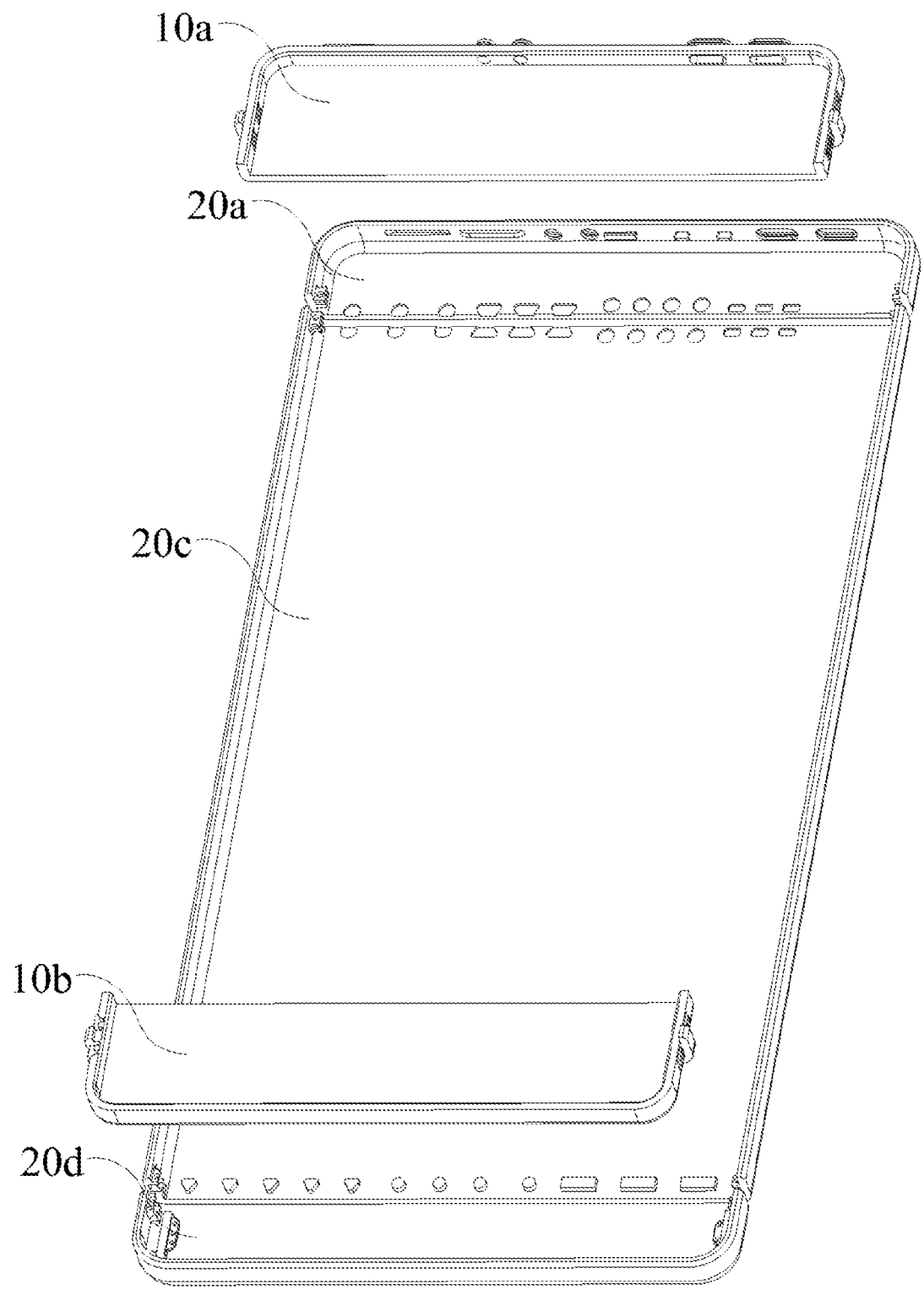
FIG. 7 is a schematic exploded view of a housing according to another embodiment of the present disclosure.

Please referring to FIG. 7, FIG. 7 is a schematic exploded view of a housing according to another embodiment of the present disclosure. The differences between the housing in this embodiment and the above-mentioned housing are that: the metal body of the housing includes a first body 20a, a third body 20c, and a fourth body 20d; the connecting body includes a first connecting body 10a and a second connecting body 10b; the first body 20a and the third body 20c are connected via the first connecting body 10a, the third body 20c and the fourth body 20d are connected via the second connecting body 10b. A plurality of mating structures (not labeled) are formed at the junctions of the first body 20a, the third body 20c, the fourth body 20d, the first connecting body 10a, and the second connecting body 10b.

In other embodiments, the number of the metal body may also be other numbers, such as 4, 5 or 6, etc., and the number of the connecting body may also be other numbers, such as 3, 4 or 5 etc., and the number of the metal body 20 is one more than the number of the connecting body 10.

Figure 8:
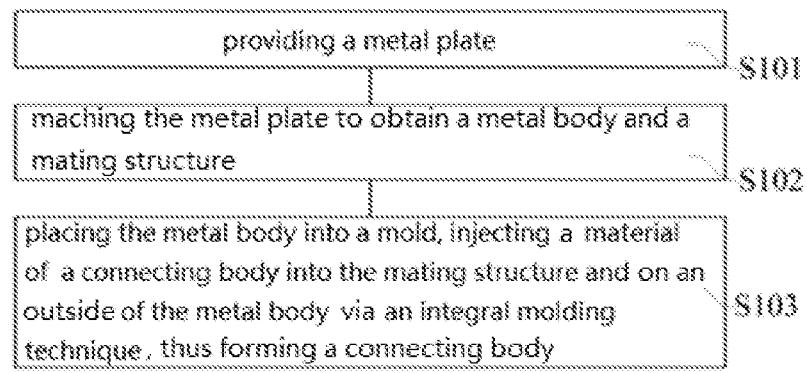
FIG. 8 is a flow chart of a housing manufacturing method according to an embodiment of the present disclosure.

Please referring to FIG. 1 and FIG. 8, FIG. 8 is a schematic flow chart of a housing manufacturing method according to an embodiment of the present disclosure.

In S101, a metal plate is provided.

The material of the metal plate includes any one selected from the group consisting of an aluminum alloy, a magnesium alloy, a stainless steel, a titanium alloy, a copper alloy, and an iron alloy, and different materials have different thermal conductivity and processing properties. Optionally, in this embodiment, the metal body 20 is made of an aluminum alloy, which is excellent in heat conduction, easy to process, moderate in price, and is also easy to perform post-process treatment, such as anodizing and drawing. The thickness is from 0.4 mm to 2 mm, such as 0.4 mm, 0.6 mm, 0.8 mm, 1.0 mm, 1.2 mm, 1.4 mm, 1.6 mm, 1.8 mm or 2.0 mm.

In S102, the metal plate is machined to obtain a metal body and a mating structure.

The metal plate is machined by a CNC machine tool to obtain a metal body and a plurality of mating structures 30. The metal body includes a first body 20a and a second body 20b. The mating structures 30 includes each one selected from the group consisting of a groove-type tension structure 31, a protrusion-type tension structure 32, a rib-type tension structure 33, a rib-in-hole type structure 34, an groove-in-hole type structure 35, and a through hole type fastening structure 36.

In S103, the metal body is placed into a mold, the material of a connecting body is injected into the mating structure and on an outside of the metal body via an integral molding technique, and thus a connecting body is formed.

The first body 20a and the second body 20b are placed into the mold. Optionally, the connecting body is made of a plastic material selected from the group consisting of PPS, PBT, PA-66, and PPA plus glass fiber. The mole is an integral injection mold. The liquid connecting body material is injected into the injection mole. The material of the connecting body enters the mating structure 30 to form a connecting body and other mating structures (not shown) such as corresponding mating structures 34a and 35a and the like. The connecting body connects the first body 20a and the second body 20b into a whole body, and the connecting body includes a first connecting body 10a.

Optionally, the connecting body may also be made of metal material. The metal material includes any one selected from the group consisting of an aluminum alloy, a magnesium alloy, a stainless steel, a titanium alloy, a copper alloy, and an iron alloy. The mole is integral die-casting mole. Then the liquid connecting body material is injected into the die-casting mole. The material of the connecting body enters the mating structure 30 to form a connecting body and other mating structures (not shown) such as corresponding mating structures 34a and 35a and the like. The connecting body connects the first body 20a and the second body 20b into a whole body, and the connecting body includes a first connecting body 10a.

Figure 9:
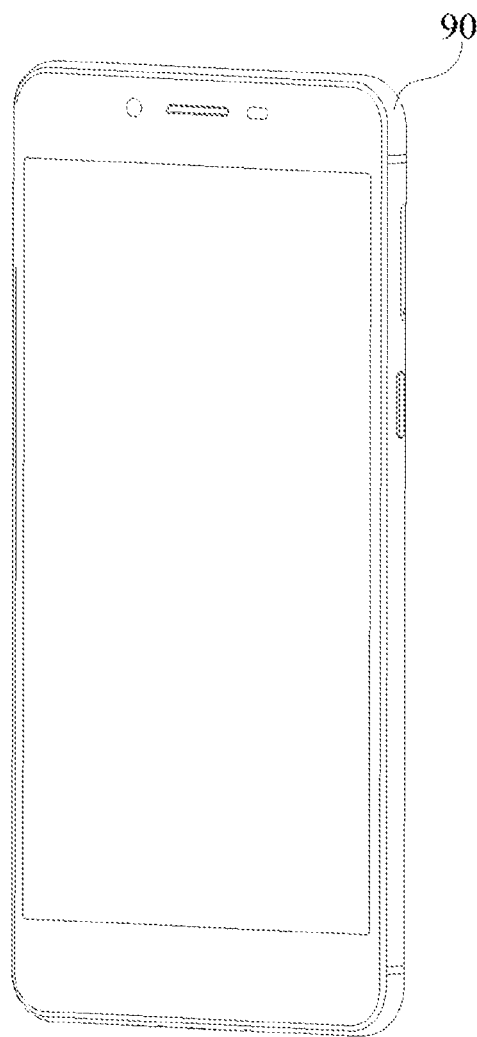
FIG. 9 is a schematic view of a mobile terminal according to an embodiment of the present disclosure.

Please referring to FIG. 9, FIG. 9 is a schematic view of a mobile terminal according to an embodiment of the present disclosure. The mobile terminal includes a housing 90, which has the technical features of the housing described in all of the above embodiments.

Different from the prior art, the housing of the present disclosure forms a plurality of mating structures at the junction of the body and the connecting body, and the mating structure includes at least one selected from the group consisting of a groove-type tension structure, a protrusion-type tension structure, a rib-type tension structure, a through hole type fastening structure, a rib-in-hole type structure, and an groove-in-hole type structure. In this way, it is possible to achieve the effect of increasing the mechanical contact area of the body and the connecting body, thereby enhancing the structural stability of the junction of the housing and ensuring the various components of the housing are not easily separated.

The above descriptions are only the embodiments of the present disclosure, and thus do not limit the scope of the present disclosure. The equivalent structure or equivalent process transformations made by using the specification and the drawings of the present disclosure, or directly or indirectly applied to other related technical fields, are all comprised in the scope of patent protection of the present disclosure.

The invention claimed is:

1. A housing, comprising:
  a metal body comprising at least a first body and a second body; and
  a connecting body connecting the first body to the second body,
  wherein each of the first body and the second body is provided with a plurality of mating structures at a junction where each of the first body and the second body is connected to the connecting body;
  the plurality of mating structures are evenly distributed at the junction; and
  the plurality of mating structures comprise: a rib-in-hole type structure with a hole being formed at the first body or the second body and a rib being formed on an inner wall of the hole along a circumferential direction of the hole, and a groove-in-hole type structure with a hole being formed at the first body or the second body and a groove being formed in an inner wall of the hole along a circumferential direction of the hole;
  the first body comprises a first body base, and a first body retaining edge connected to the first body base and perpendicular to the first body base, the first body retaining edge and the first body base are connected to form a first receiving groove, the second body comprises a second body base, and a second body retaining edge connected to the second body base and perpendicular to the second body base, and the second body retaining edge and the second body base are connected to form a second receiving groove;

the connecting body comprises a connecting body base, and a connecting body retaining edge connected to the connecting body base and perpendicular to the connecting body base; and the connecting body retaining edge and the connecting body base are connected to form a third receiving groove; and a surface of the connecting body base facing away from the third receiving groove is attached to a surface of the first body base facing the first receiving groove and a surface of the second body base facing the second receiving groove, and the first body base is connected to the second body base through the connecting body base and by means of at least one of the plurality of mating structures respectively provided at the first body base and the second body base.

2. The housing according to claim 1, wherein the plurality of mating structures further comprise at least one of a groove-type tension structure, a protrusion-type tension structure, a rib-type tension structure or a through hole type fastening structure.

3. The housing according to claim 2, wherein shapes of the groove-type tension structure and the protrusion-type tension structure comprises at least one selected from the group consisting of a semicircle, a circle, an ellipse, a dovetail, and a polygon.

4. The housing according to claim 2, wherein
the surface of the connecting body base facing away from the third receiving groove is provided with a protrusion; and a surface of the protrusion of the first connecting body base away from the third receiving groove, a surface of the first body base away from the first receiving groove, and a surface of the second body base away from the second receiving groove are coplanar.

5. The housing according to claim 4, wherein the hole is located at the first body retaining edge and/or the second body retaining edge; and
the hole comprises at least one selected from the group consisting of a USB jack, a speaker ventilation hole, an earphone jack, and a microphone input hole.

6. The housing according to claim 1, wherein the metal body further comprises a third body and an additional connecting body which connects the second body to the third body; and the third body is provided with a plurality of mating structures at a junction where the third body is connected to the additional connecting body;
the plurality of mating structures provided at the third body are evenly distributed at the junction where the third body is connected to the additional connecting body; and
the plurality of mating structures provided at the third body comprise at least one of: a rib-in-hole type structure with a hole being formed at the third body and a rib being formed on an inner wall of the hole along a circumferential direction of the hole, or a groove-in-hole type structure with a hole being formed at the third body and a groove being formed in an inner wall of the hole along a circumferential direction of the hole.

7. The housing according to claim 1, wherein the metal body is made of any one selected from the group consisting of an aluminum alloy, a magnesium alloy, a stainless steel, a titanium alloy, a copper alloy, and an iron alloy.

8. The housing according to claim 7, wherein the connecting body is made of a plastic material comprising any one selected from the group consisting of PPS, PBT, PA-66, and PPA plus glass fiber.

9. The housing according to claim 7, wherein the connecting body is made of a metal material comprising any one selected from the group consisting of an aluminum alloy, a magnesium alloy, a stainless steel, a titanium alloy, a copper alloy, and an iron alloy.

10. A mobile terminal comprising a housing, the housing comprising:
a metal body comprising at least a first body and a second body; and
a connecting body connecting the first body to the second body,
wherein each of the first body and the second body is provided with a plurality of mating structures at a junction where each of the first body and the second body is connected to the connecting body;
the plurality of mating structures are evenly distributed at the junction; and
the plurality of mating structures comprise: a rib-in-hole type structure with a hole being formed at the first body or the second body and a rib being formed on an inner wall of the hole along a circumferential direction of the hole, and a groove-in-hole type structure with a hole being formed at the first body or the second body and a groove being formed in an inner wall of the hole along a circumferential direction of the hole;
the first body comprises a first body base, and a first body retaining edge connected to the first body base and perpendicular to the first body base, the first body retaining edge and the first body base are connected to form a first receiving groove, the second body comprises a second body base, and a second body retaining edge connected to the second body base and perpendicular to the second body base, and the second body retaining edge and the second body base are connected to form a second receiving groove;
the connecting body comprises a connecting body base, and a connecting body retaining edge connected to the connecting body base and perpendicular to the connecting body base; and the connecting body retaining edge and the connecting body base are connected to form a third receiving groove; and
a surface of the connecting body base facing away from the third receiving groove is attached to a surface of the first body base facing the first receiving groove and a surface of the second body base facing the second receiving groove, and the first body base is connected to the second body base through the connecting body base and by means of at least one of the plurality of mating structures respectively provided at the first body base and the second body base.

11. The mobile terminal according to claim 10, wherein the plurality of mating structures further comprise at least one of a groove-type tension structure, a protrusion-type tension structure, a rib-type tension structure or a through hole type fastening structure.

12. The mobile terminal according to claim 11, wherein the shapes of the groove-type tension structure and the protrusion-type tension structure comprises at least one selected from the group consisting of a semicircle, a circle, an ellipse, a dovetail, and a polygon.

13. The mobile terminal according to claim 11, wherein the surface of the connecting body base facing away from the third receiving groove is provided with a protrusion; and a surface of the protrusion of the first connecting body base away from the third receiving groove, a surface of the first body base away from the first receiving groove, and a surface of the second body base away from the second receiving groove are coplanar.

14. The mobile terminal according to claim 13, wherein the hole is located at the first body retaining edge and/or the second body retaining edge; and
the hole comprises at least one selected from the group consisting of a USB jack, a speaker ventilation hole, an earphone jack, and a microphone input hole.

15. The mobile terminal according to claim 10, wherein the metal body further comprises a third body and an additional connecting body which connects the second body to the third body; and the third body is provided with a plurality of mating structures at a junction where the third body is connected to the additional connecting body;
the plurality of mating structures provided at the third body are evenly distributed at the junction where the third body is connected to the additional connecting body; and
the plurality of mating structures provided at the third body comprise at least one of: a rib-in-hole type structure with a hole being formed at the third body and a rib being formed on an inner wall of the hole along a circumferential direction of the hole, and a groove-in-hole type structure with a hole being formed at the third body and a groove being formed in an inner wall of the hole along a circumferential direction of the hole.

16. The mobile terminal according to claim 10, wherein the metal body is made of any one selected from the group consisting of an aluminum alloy, a magnesium alloy, a stainless steel, a titanium alloy, a copper alloy, and an iron alloy;
the connecting body is made of a plastic material comprising any one selected from the group consisting of PPS, PBT, PA-66, and PPA plus glass fiber.

* * * * *